United States Patent [19]
Wilson

[11] 4,317,985
[45] Mar. 2, 1982

[54] DUAL HEATER STABILIZATION APPARATUS AND METHOD FOR A CRYSTAL OVEN

[75] Inventor: Robert L. Wilson, Santa Clara, Calif.

[73] Assignee: Hewlett-Packard Company, Palo Alto, Calif.

[21] Appl. No.: 43,293

[22] Filed: May 29, 1979

[51] Int. Cl.³ .............................................. H05B 3/00
[52] U.S. Cl. ................................. 219/210; 219/397; 219/413; 219/497
[58] Field of Search ............... 219/210, 395, 397, 413, 219/412, 497, 510; 236/1 R; 165/30; 250/36

[56] References Cited

U.S. PATENT DOCUMENTS

| | | | |
|---|---|---|---|
| 2,524,886 | 10/1950 | Colander et al. | 219/210 |
| 2,731,564 | 1/1956 | Edlstein | 250/36 |
| 2,920,175 | 1/1960 | Keen et al. | 219/210 |
| 3,028,473 | 4/1962 | Dyer et al. | 219/210 X |
| 3,040,158 | 6/1962 | Cutler et al. | 219/210 |
| 3,155,157 | 11/1964 | Anderson et al. | 165/30 |
| 3,413,438 | 11/1968 | Gardner et al. | 219/210 |

*Primary Examiner*—Volodymyr Y. Mayewsky
*Attorney, Agent, or Firm*—Jon R. Stark; Edward Y. Wong; Michael L. Sherrard

[57] ABSTRACT

A proportional oven having two heaters mounted to a thermally conductive base stabilizes the temperature of a temperature sensitive crystal mounted on the thermally conductive base by adjusting the ratio of powers applied to the two heaters.

8 Claims, 3 Drawing Figures

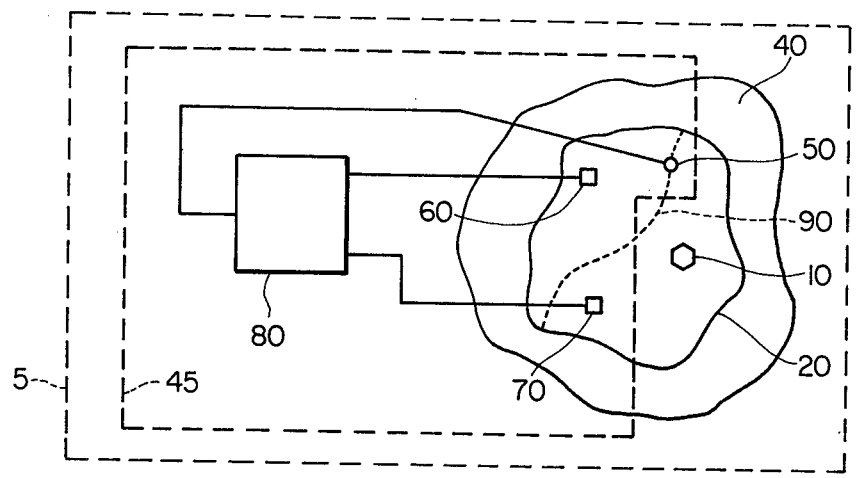
FIG_1
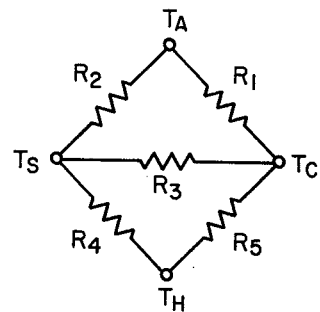
FIG_2
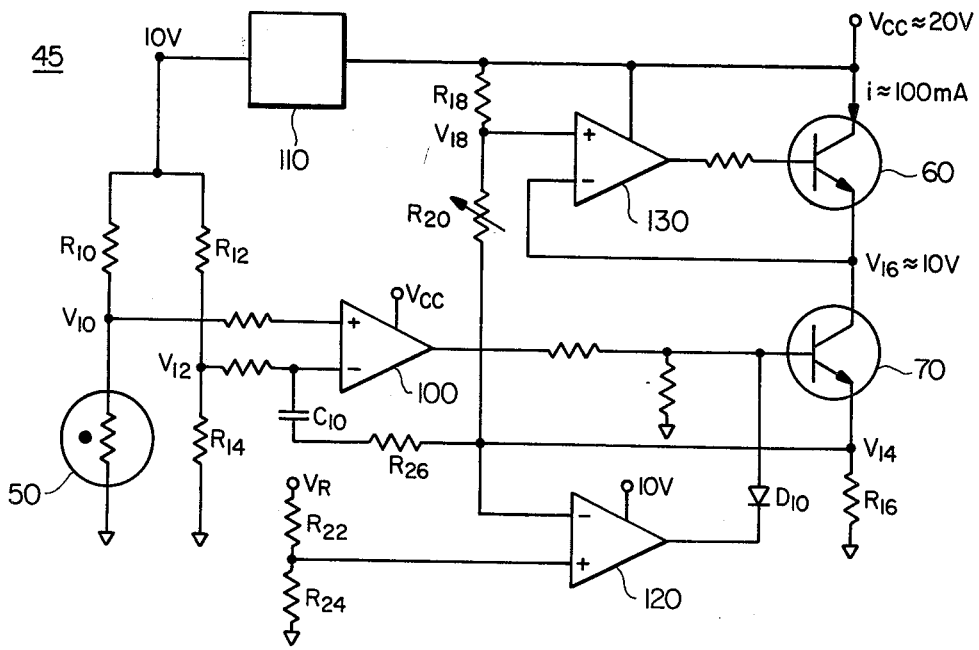
FIG_3

DUAL HEATER STABILIZATION APPARATUS AND METHOD FOR A CRYSTAL OVEN

BACKGROUND OF THE INVENTION

1. Field of the Invention

The present invention relates to the field of temperature stabilization. Particularly, the present invention is related to the field of temperature stabilized ovens used to isolate crystal oscillators from variations in temperature of the external environment.

2. Description of the Prior Art

Crystal ovens, such as the one described in U.S. Pat. No. 3,040,158 issued to Leonard S. Cutler, Palo Alto, California, on June 19, 1962, typically consist of a quartz crystal mounted on a thermally conductive base which is thermally isolated from the external environment. The temperature of the thermally conductive base is sensed at a location close to the crystal by a temperature sensor, such as a thermistor. The thermistor is coupled to an oven controller which controls the power applied to a heater, also mounted to the thermally conductive base. In a proportional oven, the oven controller varies the current to the heater or the duty cycle of the heater voltage in response to the difference between the sensed oven temperature and the desired oven temperature. In this type of oven, the temperature of the crystal is relatively insensitive to variations in the external temperature.

The term "thermal gain" is a figure of merit which describes the temperature stabilization of a crystal oven. More specifically, thermal gain is defined as the ratio of the change in the external temperature to the corresponding change in temperature of a reference, such as the quartz crystal or the temperature sensor. As described above, the thermal gain at the precise location of the temperature sensor can be made quite high by using high gains in the negative feedback control loop of the oven controller. However, it has been empirically determined that the thermal gain between the crystal and the external environment is lower than the thermal gain between the temperature sensor and the external environment even when the sensor and the crystal are mounted very close to one another. Further, it has been determined that different locations on the thermally conductive base are characterized by significantly different thermal gains. Therefore, in order to obtain the desired high thermal gain between the crystal and the external environment, it has become common practice to physically move either the crystal, the sensor, or the heater until a high thermal gain is obtained.

It has also been determined that the thermal gain of specific locations on the thermally conductive base vary as the thermal geometry of the thermally conductive base is changed. This results in a change in the thermal gain of a specific location of the thermally conductive base every time a small hole is drilled in the base, part of the base is milled, or a new component is attached to the base. Thus, a change in the thermal geometry of an oven may result in a need to relocate the crystal or a control element.

In practice, the need to relocate elements by trial and error in order to achieve high thermal gains between the crystal and the external environment creates great difficulties in the design of a crystal oven. This is especially so since this trial and error relocation must be redone every time the thermal geometry of the thermally conductive base is changed.

SUMMARY OF THE INVENTION

In accordance with the illustrated preferred embodiments, the present invention provides apparatus and method for controlling the temperature of an oven having a temperature sensitive element such as a crystal mounted to a thermally conductive base. The temperature of the thermally conductive base is sensed at a first location. The controller varies the power applied to first and second heaters which are also mounted to the thermally conductive base, in response to the sensed temperature. The controller allows for adjusting the ratio between the powers supplied by the first and second heaters. By adjusting the ratio of the powers applied to the two heaters, the thermal gain between the temperature responsive element and the external environment can be increased.

DESCRIPTION OF THE DRAWINGS

FIG. 1 is an illustration of a generalized crystal oven having two heaters in accordance with the preferred embodiment of the present invention.

FIG. 2 is a schematic diagram of an electrical model of a crystal oven having a single heater.

FIG. 3 is a detailed schematic diagram of the temperature stabilization circuit of FIG. 1.

DETAILED DESCRIPTION OF THE PREFERRED EMBODIMENT

In FIG. 1, there is shown an illustration of a generalized crystal oven 5 having two heaters. A temperature sensitive crystal 10 is mounted to a thermally conductive base 20 which is thermally isolated from an external environment 30 by a foam insulation 40. A temperature stabilization circuit 45 comprises a temperature sensor 50 mounted to thermally conductive base 20 at a first position, a first heater 60 mounted to thermally conductive base 20 at a second position, and a second heater 70 mounted to thermally conductive base 20 at a third position. Temperature sensor 50 and first and second heaters 60 and 70 are further coupled to an oven controller 80 which regulates the power applied to the heaters as a function of the temperature sensed by temperature sensor 50. Specifically, oven controller 80 varies the current to the heaters in response to the difference between the sensed temperature and a desired temperature. Preferably, the desired temperature is about 80° C. It has been empirically determined that there is a thermal gain contour line 90 passing through temperature sensor 50 which is characterized by a high thermal gain. It is desirable to have quartz crystal 10 located on this high thermal gain contour line.

FIG. 2 is an electrical model of a crystal oven having a single heater. A thermal conductivity between crystal 10 and external environment 30 can be molded as a distributed resistance R1 which has a value of approximately 20°C./watt. A thermal resistance between temperature sensor 50 and external environment 30 is modeled by distribution resistance R2 which has a value of approximately the same order of magnitude as resistance R1. Thermal resistances between temperature sensor 50, crystal 10, and heater 60 are quite small due to the common mounting on thermally conductive base 20. These resistances are modeled as R3, R4 and R5. $T_A$ is the ambient temperature of external environment 30, $T_C$ is the temperature of crystal 10, $T_S$ is the temperature of sensor 50, and $T_H$ is the temperature of heater 60. This simple model would predict that once the components were properly located, a balanced condition could be established where the temperature $T_S$ equalled the temperature $T_C$. Once this condition is achieved, the thermal gain of crystal 10 would be the same as the thermal gain of temperature sensor 50. Further, this model would predict that there would be a high thermal gain contour line 90 which would comprise points where the appropriate values of R4 and R5 balance the bridge, that is, where no heat is conducted between the temperature sensor 50 and the crystal 10.

In one embodiment of the present invention, instead of moving any of the components, two heaters are used and the ratio of the power applied to the two heaters is adjusted. Using a super-position analogy, it appears that the two heaters can be modeled by a single virtual heat source located on a line or contour between the heaters. The location of the virtual heat source on the line is a function of the ratio of the powers applied to the two heaters. Using this analogy, the position of the virtual heat source can be moved by appropriately adjusting the ratio of the powers between the heaters. This in turn will vary the relative values of the thermal resistances R4 and R5 in the model described above.

By varying the ratio between the power applied to heaters 60 and 70, the virtual heat source can be moved to vary the high thermal gain contour line 90 such that it passes through crystal 10. Thus, the temperatures at sensor 50 and crystal 10 can be equalized to maximize the thermal gain to the crystal. However, in practice, it is difficult to determine the absolute temperature of crystal 10. One way of determining the appropriate ratio between the powers applied to the heaters is to monitor the temperature sensitive signal from the crystal and note its variation as the temperature of the external environment is varied. Thus, the frequency of quartz crystal 10 could be monitored as the ambient temperature of the external environment is varied. By testing different power ratios between the heaters, an optimal value can be selected.

According to the electrical model, the location of the virtual heat source should be approximately equal distant from the location of temperature sensor 50 and crystal 10. Thus, in order to provide a more efficient adjustment of the location of the virtual heat source it appears that heaters 60 and 70 should be located on a line which is parallel to a line drawn through temperature sensor 50 and crystal 10.

FIG. 3 is a detailed schematic diagram of the temperature stablization circuit 45 of FIG. 1. Temperature sensor 50 is a thermistor having a resistance which varies with the temperature. Resistor R10 has a resistance equal to the resistance of the thermistor at the desired temperature such that voltage $V_{10}$ equals approximately 5 volts at the desired temperature. Resistors R12 and R14 have equal values which sets voltage $V_{12}$ to 5 volts. Thus, differential amplifier 100 is in its linear operating range during the stable condition where the temperature of the sensor is near the desired temperature. The voltage applied to resistors R10 and R12 is precisely controlled by a voltage regulator 110 which maintains a precise 10 volt reference.

The voltage output from differential amplifier 100 is applied to the base of transistor heater 70. In operation, an increase in the temperature of external environment 30 will cause the resistance of thermistor 50 to decrease. This causes voltage $V_{10}$ to decrease and differential amplifier 100 to apply a smaller base current to heater 70. As a result, the power dissipated by transistor heater 70 is reduced. Similarly, a decrease in the temperature of external environment 30 will cause an increase in the power dissipated by heater 70.

Resistor R16 has a resistance of approximately 0.5 ohms. A current (i) having a preferred amplitufde of 100 mA flows from a voltage source $V_{CC}$ through transistor heaters 60 and 70 and resistor 16. Thus, the voltage $V_{14}$ is a function of the current (i) through the transistor heaters and the resistance of resistor R16. Since both transistors have the same current flowing through them, the ratio of the powers of the two heaters is a function of the ratio of the voltage drops across them. Thus, the power dissipated by transistor heater 60 is proportional to the difference between voltages $V_{CC}$ and $V_{16}$. The power dissipated by transistor heater 70 is proportional to the difference between voltages $V_{16}$ and $V_{14}$.

Differential amplifier 130 is coupled in such a way as to keep $V_{18}$ equal to $V_6$. Thus, it can be shown that the power ratio of the powers dissipated by transistor heaters 60 and 70 is a function of the ratio of the resistances R18 and R20. By varying the resistance of R18 or R20, the power ratio between the transistor heaters can be adjusted as desired.

Differential amplifier 120 limits the power that can be dissipated by the transistor heaters in a start up condition. Specifically, voltage $V_{14}$ is proportional to the current through the transistor heaters. Differential amplifier 120 is coupled to resistance R16 to sense voltage $V_{14}$ and to drain current from the base of transistor heater 70 when the voltage $V_{14}$ exceeds a value determined by a reference voltage $R_R$ and the resistive divider comprising resistors R22 and R24. When the current through resistor R16 decreases to a value below a predetermined limit, the differential amplifier 120 is decoupled from the base of transistor heater 70 by diode $D_{10}$. Finally, capacitor $C_{10}$ and resistor $R_{26}$ are coupled in a feedback circuit between transistor heater 70 and differential amplifier 100 to provide for AC stablization.

I claim:
1. A method for controlling the temperature of an oven having a temperature sensitive element mounted to a thermally conductive base, the method comprising the steps of:
   sensing the temperature of the thermally conductive base at a first position;
   heating the base at a second position, the power applied to the second position being responsive to the temperature sensed at the first position;
   heating the base at a third position, the power applied to the third position being a multiple of the power applied to the second position;
   sensing a temperature responsive signal from the temperature sensitive element; and
   adjusting the multiple in response to the temperature responsive signal.

2. A method of controlling the temperature of an oven having a temperature sensitive element mounted to a thermally conductive base as in claim 1 wherein the multiple is adjusted to match the temperatures of the temperature sensitive element and the temperature of the thermally conductive base at the first position.

3. A method for controlling the temperature of an oven having a temperature sensitive element mounted to a thermally conductive base as in claim 1 wherein the thermally conductive base is thermally insulated from the environment external to the oven, the method further comprising the steps of varying the temperature of the environment external to the oven and adjusting the multiple to reduce the variation in the temperature responsive signal from the temperature sensitive element resulting therefrom.

4. A proportional oven for stabilizing the temperature of a temperature sensitive element mounted on a thermally conductive base comprising:

a temperature sensor mounted to the thermally conductive base at a first position and having an output for providing a signal on the output in response to the temperature of the thermally conductive base at the first position;

first and second heaters mounted to the thermally conductive base at second and third positions respectively; and heater control means coupled to the temperature sensor output and to said first and second heaters for applying power to said first and second heaters in response to the signal on the output of the temperature sensor, the power applied to the first heater being a multiple of the power applied to the second heater; wherein said heater control means further comprises power multiple adjustment means for adjusting the multiple.

5. The method for controlling the temperature of an oven having a temperature sensitive element mounted to an electrically non-conductive thermally conductive base as in claim 1, wherein each of the steps therein is achieved electrically.

6. The method for controlling the temperature of an oven having a temperature sensitive element mounted to an electrically non-conductive thermally conductive base as in claim 2, wherein each of the steps therein is achieved electrically.

7. The method for controlling the temperature of an oven having a temperature sensitive element mounted to an electrically non-conductive thermally conductive base as in claim 3, wherein each of the steps therein is achieved electrically.

8. The proportional oven for stabilizing the temperature of a temperature sensitive element mounted on an electrically non-conductive thermally conductive base as in claim 4, wherein:

said temperature sensor is electrical;
said first and second heaters are electrical;
said heater control means is electrical; and
said power applied to said heaters is electrical.

* * * * *

UNITED STATES PATENT AND TRADEMARK OFFICE
CERTIFICATE OF CORRECTION

PATENT NO. : 4,317,985

DATED : March 2, 1982

INVENTOR(S) : Robert L. Wilson

It is certified that error appears in the above-identified patent and that said Letters Patent are hereby corrected as shown below:

Column 2, line 57, delete "molded" and insert --modeled--;

Column 2, line 61, delete "distribution" and insert --distributed--;

Column 4, line 20 delete "$V_6$" and insert -- $V_{16}$--;

Column 4, line 33, delete "$P_R$" and insert --$V_R$--;

Signed and Sealed this

Twenty-fifth Day of May 1982

[SEAL]

Attest:

Attesting Officer

GERALD J. MOSSINGHOFF

Commissioner of Patents and Trademarks